(12) United States Patent
Chao et al.

(10) Patent No.: US 8,806,417 B1
(45) Date of Patent: Aug. 12, 2014

(54) RULE COVERAGE RATE AUTO-EXTRACTION AND RULE NUMBER AUTO-MARK

(71) Applicant: Taiwan Semiconductor Manufacturing Co., Ltd., Hsin-Chu (TW)

(72) Inventors: Chih-Ming Chao, Hsinchu (TW); Jyh-Kang Ting, Baoshan Township (TW); Chin-An Chen, Zhudong Township (TW); Pei-tzu Wu, Hsinchu (TW); Chun-Yi Lee, Beipu Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/871,165

(22) Filed: Apr. 26, 2013

Related U.S. Application Data

(60) Provisional application No. 61/779,019, filed on Mar. 13, 2013.

(51) Int. Cl.
*G06F 17/50* (2006.01)
(52) U.S. Cl.
USPC ............ 716/136; 716/118; 716/119; 716/139

(58) Field of Classification Search
USPC ......... 716/106, 111–112, 118–119, 122–123, 716/136, 139
See application file for complete search history.

(56) References Cited

U.S. PATENT DOCUMENTS

| | | | |
|---|---|---|---|
| 7,487,479 B1* | 2/2009 | Malik et al. | 716/100 |
| 8,347,240 B2* | 1/2013 | Agarwal et al. | 716/54 |
| 8,516,431 B2* | 8/2013 | Yaguchi | 716/136 |
| 8,589,844 B2* | 11/2013 | Muddu et al. | 716/111 |

* cited by examiner

*Primary Examiner* — Nghia Doan
(74) *Attorney, Agent, or Firm* — Eschweiler & Associates, LLC

(57) ABSTRACT

A target integrated circuit layout having a plurality of design rules having minimum rules and standard rules used in the target integrated circuit layout is provided. First and second design rule checks are performed, where respective first and second sets of violations of the plurality of design rules and each design rule associated with the first and second sets of violations are recorded. An analysis is performed on the first and second sets of violations, each design rule associated with the first and second sets of violations, and a frequency of usage of each of the plurality of design rules, and a rule usage rate is determined having a number of minimum rules used overall and a number of overall violations of the design rules. An interactive rule database is formed having statistics associated with the rule usage rate for subsequent implementation in an integrated circuit.

25 Claims, 3 Drawing Sheets

1

RULE COVERAGE RATE AUTO-EXTRACTION AND RULE NUMBER AUTO-MARK

CROSS REFERENCE TO RELATED APPLICATION

This application is a Non-Provisional Patent Application claiming priority to U.S. Provisional Patent Application Ser. No. 61/779,019 filed Mar. 13, 2013, entitled "Design Rule Coverage Rate Auto-Extraction and Rule Number Auto-Mark" in the name of Chih-Ming Chao, et al., and is hereby incorporated by reference.

BACKGROUND

In semiconductor manufacturing, a semiconductor wafer often undergoes many processing steps or stages before a completed die is formed. For example, lithographic processes are performed on the semiconductor wafer using a mask and photoresist to transfer a particular design or layout onto the wafer. Design Rules (DRs) are a series of parameters provided by semiconductor manufacturers that enable a designer to verify the correctness of a mask or mask set. Design rules are often specific to a particular semiconductor manufacturing process. A design rule set specifies certain geometric and connectivity restrictions to, among other things, ensure sufficient margins to account for variability in semiconductor manufacturing processes, so as to ensure that most of the resultant components work as designed.

Conventional basic design rules 10 are illustrated in FIG. 1 for single-layer rules. A width rule 12 specifies the minimum width of any shape or object 14 in the design. A spacing rule 16 specifies the minimum distance between two adjacent shapes or objects 14. Such rules typically exist for each layer formed in the semiconductor manufacturing process, with the lowest layers having the smallest rules, and the highest metal layers having larger rules.

A two-layer rule specifies a relationship that should exist between two layers. For example, an enclosure rule 18 can specify that an object 20 of one type, such as a contact or via, must be covered, with some additional margin, by a metal layer 22. Other design rules, such as minimum area rules are also utilized. Minimum area rules designate a minimum area to be masked or formed, while antenna rules are more complex rules that check ratios of areas of multiple layers of a net for configurations that can result in problems when intermediate layers are etched. Various other design rules can also be provided by the semiconductor manufacturer.

Design Rule Checking (DRC) further determines whether the physical layout of a particular chip layout satisfies a series of Design Rules. Design rule checking is a major step during physical verification signoff on the design, and can also involve a Layout Versus Schematic (LVS) check, XOR Checks, Electrical Rule Check (ERC) and Antenna Checks. For advanced processes some fabs also insist upon the use of more restricted rules to improve yield.

Over time, device sizes are becoming smaller and smaller, and design rule sets have become increasingly more complex with each subsequent generation of semiconductor process. As such, extensive periods of time are spent design rule checking and manually examining statistics associated with the design rules and DRCs.

BRIEF SUMMARY

The following presents an overview of the disclosure in order to provide a basic understanding of one or more aspects of the disclosure. This is not an extensive overview of the disclosure, and is neither intended to identify key or critical elements of the invention, nor to delineate the scope thereof. Rather, the primary purpose of the summary is to present some concepts of the disclosure in a simplified form as a prelude to the more detailed description that is presented later.

According to various embodiments, the present disclosure relates to a method for analyzing an integrated circuit layout. The method comprises providing a target integrated circuit layout having a plurality of design rules associated therewith. The plurality of design rules, for example, comprise minimum rules and standard rules used in the target integrated circuit layout. The minimum rules, for example, are associated with smallest limitations of the respective design rules, and the standard rules are associated with limitations that are greater than the respective minimum rules.

A first design rule check is performed on the target integrated circuit layout, wherein a first set of violations of the plurality of design rules and each design rule respectively associated with the first set of violations are recorded. According to other examples, a second design rule check, such as a reverse design rule check, is performed on the target integrated circuit layout, wherein a second set of violations of the plurality of design rules and each design rule respectively associated with the second set violations are recorded.

An analysis of the first set of violations, second set of violations, each design rule respectively associated with the first set of violations and second set of violations, and a frequency of usage of each of the plurality of design rules is further performed, wherein a rule usage rate is determined based on the analysis. The rule usage rate, for example, comprises an overall number of minimum rules used throughout the target integrated circuit layout. In another example, the rule usage rate further comprises a number of violations of each design rule respectively associated with the first set of violations and second set of violations.

A rule database is further compiled or otherwise formed, wherein statistics associated with the rule usage rate are defined and utilized in subsequent implementation of the target integrated circuit layout. Forming the rule database, for example, may comprise forming a searchable database of the rule usage rate and one or more of the first set of violations, second set of violations, each design rule respectively associated with the first set of violations and second set of violations, and the frequency of usage of each of the plurality of design rules. Further, a value associated with each design rule respectively associated with the first set of violations and second set violations of the plurality of design rules can be recorded and further implemented in the rule database. The value, for example, comprises a measurement of a feature associated with the respective design rule.

In accordance with various examples, the rule usage rate can be further mapped across the target integrated circuit layout. Mapping the rule usage rate across the target integrated circuit layout, for example, can further comprises marking rules as acceptable or unacceptable based on one or more of the analysis and an operator intervention.

One or more of the one or more of the minimum rules and/or design rules respectively associated with the first set of violations and second set of violations can be replaced with a standard rule based, at least in part, on the rule usage rate, therein defining a modified integrated circuit layout. Such replacement with a standard rule generally improves a pass/fail yield rate associated with the target integrated circuit layout.

One or more of performing the first design rule check, second design rule check, analysis, determination of the rule usage rate, and forming the rule database can be repeated in an iterative manner after substituting the target integrated circuit layout with the modified integrated circuit layout.

A photolithography mask can be further generated based on the modified integrated circuit layout, wherein a number minimum design rules utilized in the mask is advantageously minimized.

DETAILED DESCRIPTION

Figure 1:
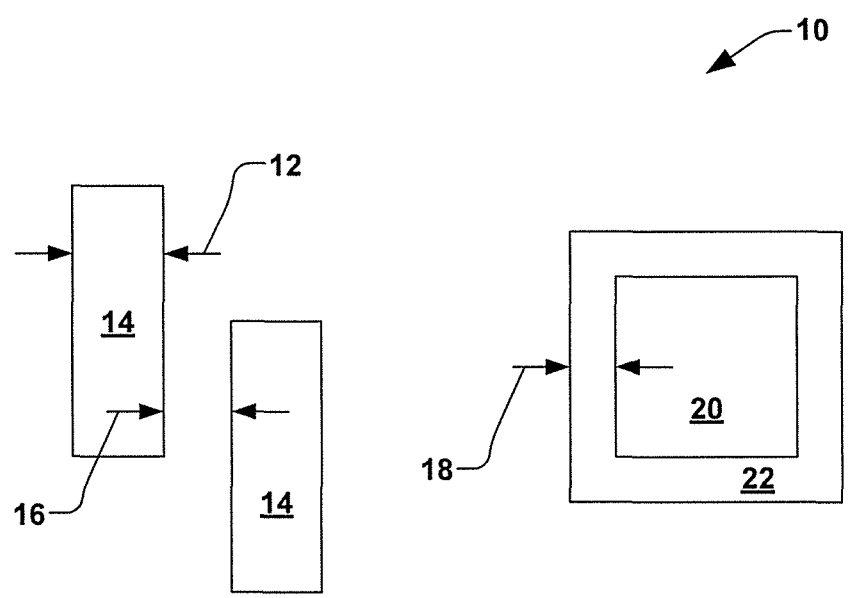
FIG. 1 illustrates exemplary Design Rules according to several aspects of the present disclosure.

The present disclosure provides a method for analyzing an integrated circuit (IC) layout. Accordingly, the description is made with reference to the drawings, in which like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Figure 2:
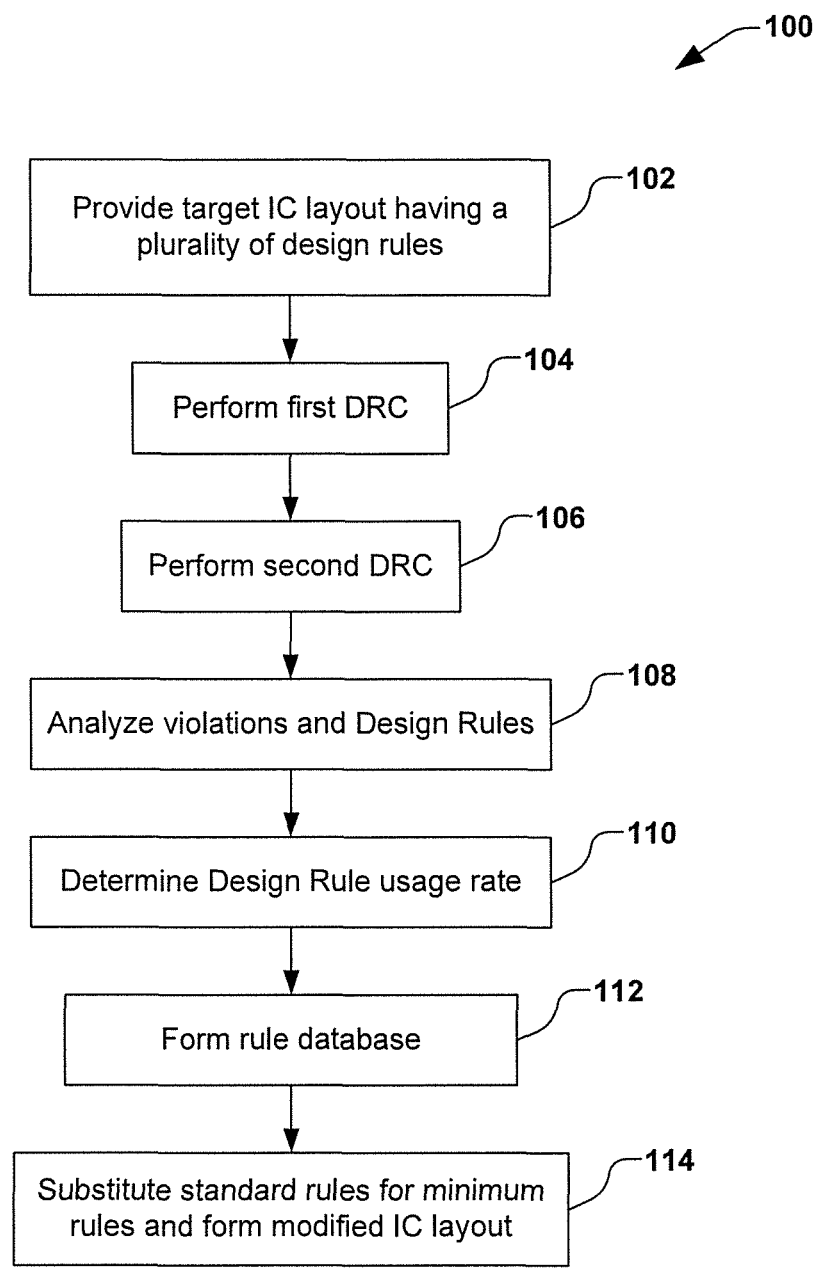
FIG. 2 illustrates a methodology for analyzing a design rule coverage rate in accordance with various aspect of the present disclosure.
Figure 3:
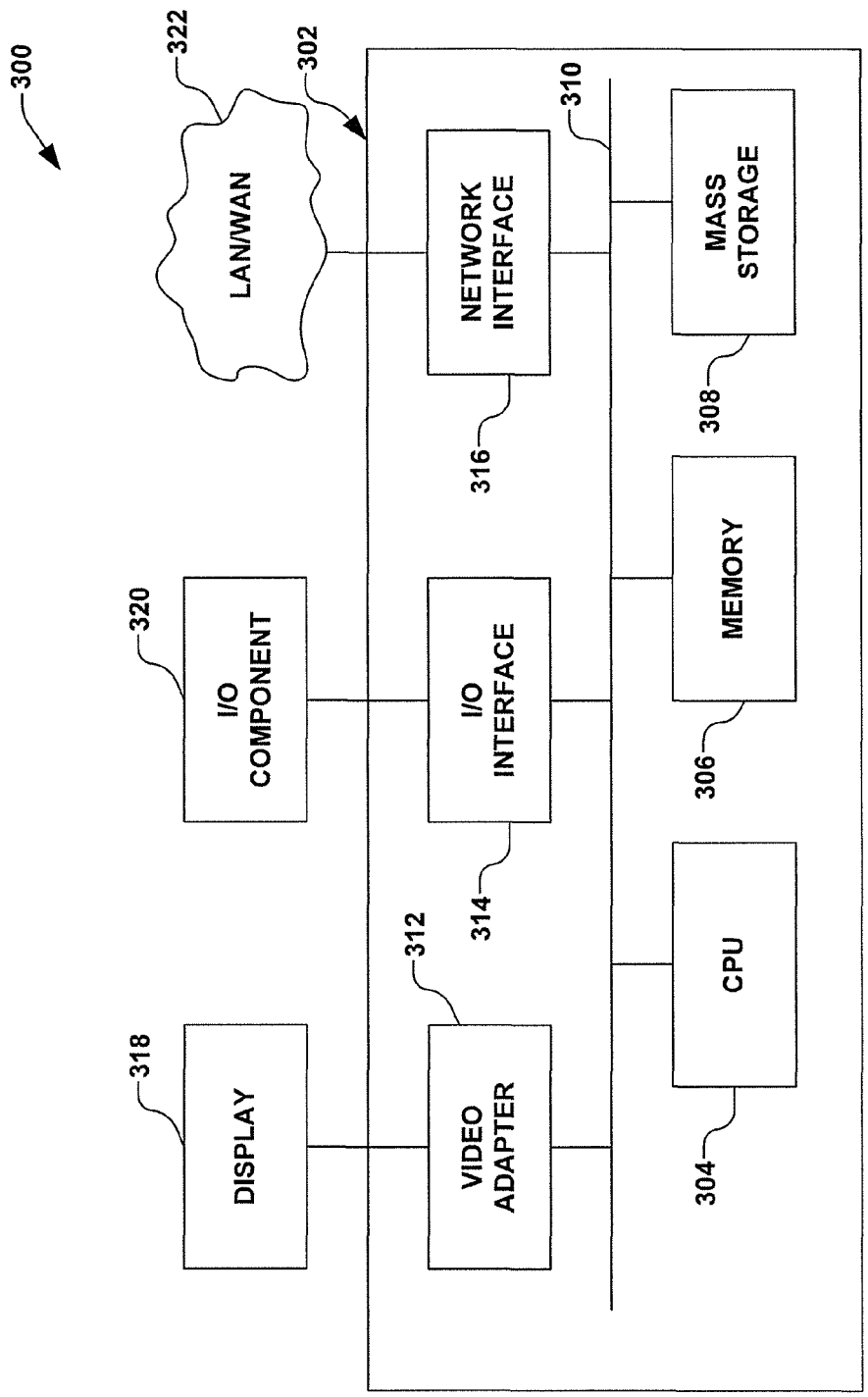
FIG. 3 illustrates a schematic representation of a processor-based system for analyzing a design rule coverage rate.

Referring now to the Figures, a method 100 for analyzing an integrated circuit layout is provided in FIG. 2. The method 100, for example, comprises providing a target integrated circuit layout having a plurality of design rules associated therewith in act 102. The target integrated circuit layout, for example, is provided in a Graphic Database System (GDS) format. The plurality of design rules, for example, comprise minimum rules and standard rules used in the target integrated circuit layout. The minimum rules are associated with smallest limitations of the respective design rules, and the standard rules are associated with limitations that are greater than the respective minimum rules.

For example, a minimum rule comprises a design rule (DR) associated with a one or more of a minimum feature size, a minimum width and/or spacing of features, a minimum area occupied by a feature, antenna rules, and/or various other rules associated with semiconductor layouts. The plurality of design rules, including the minimum rules, can be provided by a customer, a fabrication shop, or other entity, wherein the minimum rules, for example, are associated with a capability of the respective entity to fabricate viable products at or above the minimum design rules. The inventors presently appreciate that the larger the number of minimum rules utilized in a layout, the greater the likelihood of failure of the resultant product.

In act 104, a first design rule check (DRC) is performed on the target integrated circuit layout, wherein a first set of violations of the plurality of design rules is recorded. Furthermore, each design rule respectively associated with each of the first set of violations is recorded in act 104. A value associated with each design rule that is associated with the first set of violations may be further recorded in act 104. The value recorded in act 104, for example, comprises a measurement of a feature associated with the respective design rule that is in violation of the design rule check.

A second design rule check, such as a reverse design rule check, for example, is also performed on the target integrated circuit layout in act 106, wherein a second set of violations of the plurality of design rules is recorded. Further, each design rule respectively associated with the second set violations is recorded in act 106. Again, in another example, a value associated with each design rule that is associated with the second set of violations is also recorded in act 106. The value recorded in act 106, for example, comprises a measurement of a feature associated with the respective design rule that is in violation of the reverse design rule check.

Accordingly, in act 108, an analysis is performed on the first set of violations, second set of violations, and each design rule respectively associated with the first set of violations and second set of violations. A frequency of usage of each of the plurality of design rules is also analyzed in act 108, wherein a rule usage rate can be determined in act 110 based on the analysis in act 108. The rule usage rate, for example, can comprise the overall number of minimum rules used in the integrated circuit layout. The rule usage rate, for example, can further comprise a number of violations of the design rules respectively associated with the first set of violations and second set of violations.

In act 112, a rule database is formed, wherein statistics associated with the rule usage rate determined in act 110 are defined. The rule usage database, for example, comprises an interactive rule usage database. For example, the rule database formed in act 112 can be utilized in subsequent implementation and/or modification of the target integrated circuit layout. Forming the rule database, for example, comprises forming a searchable database of the rule usage rate and one or more of the first set of violations, second set of violations, each design rule respectively associated with the respective first set of violations and second set of violations, and the frequency of usage of each of the plurality of design rules. Accordingly, an accurate assessment of the design rule usage, design rule violations, minimum design rule usage, and data associated with the actual design rule, such as feature size, can be easily stored and searched in the database for use in subsequent analysis and/or modification of the target integrated circuit layout.

For example, in act 114, one or more of the design rules respectively associated with the first set of violations and second set of violations, and/or one or more of the minimum rules can be substituted with a standard rule based, at least in part, on the rule usage rate, therein defining a modified integrated circuit layout. Replacing one or more of the minimum design rules respectively associated with the first set of violations and second set of violations with a standard rule, for example, can advantageously improve a pass/fail yield rate associated with the target integrated circuit layout, as the standard design rule will provide a greater margin for error in subsequent processing, such as generating a photolithography mask based on the modified integrated circuit layout.

Furthermore, the rule usage rate can be mapped across the target integrated circuit layout, wherein a designer can be advantageously apprised of the number of minimum rules being utilized, and can make appropriate modifications to improve yield. For example, mapping the rule usage rate across the target integrated circuit layout can comprise automatically marking design rules as acceptable or unacceptable based on one or more of the analysis and an operator intervention.

In accordance with another example, performing the design rule check in act 104, the reverse design rule check in act 106, the analysis in act 108, determining the rule usage rate in act 110, and forming the interactive rule database in act 112 is repeated after substituting the target integrated circuit layout with the modified integrated circuit layout. In other words, acts 104, 106, 108, 110, and 112 can be performed iteratively, wherein each iteration can provide substantial improvement in yield rates.

In accordance with another aspect, the aforementioned methodology may be implemented using computer program code in one or more general purpose computer or processor based system. As illustrated in FIG. 300, a block diagram is provided of a processor based system 300 is provided in accordance with another embodiment for analyzing a design rule coverage rate. The processor based system 300 is a general purpose computer platform and may be used to implement processes discussed herein. The processor based system 300 may include a processing unit 302, such as a desktop computer, a workstation, a laptop computer, or a dedicated unit customized for a particular application. The processor based system 300 may be equipped with a display 318 and one or more input/output devices 320, such as a mouse, a keyboard, or printer. The processing unit 302 may include a central processing unit (CPU) 304, memory 306, a mass storage device 308, a video adapter 312, and an I/O interface 314 connected to a bus 310.

The bus 310 may be one or more of any type of several bus architectures including a memory bus or memory controller, a peripheral bus, or video bus. The CPU 304 may include any type of electronic data processor, and the memory 306 may include any type of system memory, such as static random access memory (SRAM), dynamic random access memory (DRAM), or read-only memory (ROM).

The mass storage device 308 may include any type of storage device configured to store data, programs, and other information and to make the data, programs, and other information accessible via the bus 310. The mass storage device 308 may include, for example, one or more of a hard disk drive, a magnetic disk drive, or an optical disk drive.

The video adapter 312 and the I/O interface 314 provide interfaces to couple external input and output devices to the processing unit 302. Examples of input and output devices include the display 318 coupled to the video adapter 312 and the I/O device 320, such as a mouse, keyboard, printer, and the like, coupled to the I/O interface 314. Other devices may be coupled to the processing unit 302, and additional or fewer interface cards may be utilized. For example, a serial interface card (not shown) may be used to provide a serial interface for a printer. The processing unit 302 also may include a network interface 316 that may be a wired link to a local area network (LAN) or a wide area network (WAN) 322 and/or a wireless link.

It should be noted that the processor based system 300 may include other components. For example, the processor based system 300 may include power supplies, cables, a motherboard, removable storage media, cases, and the like. These other components, although not shown, are considered part of the processor based system 300.

Embodiments of the present disclosure may be implemented on the processor based system 300, such as by program code executed by the CPU 304. Various methods according to the above-described embodiments may be implemented by program code. Accordingly, explicit discussion herein is omitted.

Further, it should be noted that the modules and devices in FIG. 1 may all be implemented on one or more processor based systems 300 of FIG. 5. Communication between the different modules and devices may vary depending upon how the modules are implemented. If the modules are implemented on one processor based system 300, data may be saved in memory 306 or mass storage 308 between the execution of program code for different steps by the CPU 304. The data may then be provided by the CPU 304 accessing the memory 306 or mass storage 308 via bus 310 during the execution of a respective step. If modules are implemented on different processor based systems 300 or if data is to be provided from another storage system, such as a separate database, data can be provided between the systems 300 through I/O interface 314 or network interface 316. Similarly, data provided by the devices or stages may be input into one or more processor based system 300 by the I/O interface 314 or network interface 316. A person having ordinary skill in the art will readily understand other variations and modifications in implementing systems and methods that are contemplated within the scope of varying embodiments.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

While the method(s) provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method for analyzing an integrated circuit layout, the method comprising:
   providing a computer program product having a non-transitory computer readable medium with a computer program embodied thereon, the computer program comprising a computer program code for:
   providing a target integrated circuit layout having a plurality of design rules associated therewith;
   performing a first design rule check on the target integrated circuit layout, wherein a first set of violations of the plurality of design rules and each design rule respectively associated with the first set of violations are recorded;
   performing a second design rule check on the target integrated circuit layout, wherein a second set of violations of the plurality of design rules and each design rule respectively associated with the second set violations are recorded;
   performing an analysis of the first set of violations, second set of violations, each design rule respectively associated with the first set of violations and second set of violations, and a frequency of usage of each of the plurality of design rules;
   determining a rule usage rate based on the analysis, the rule usage rate comprising an overall number of the frequency of usage of minimum rules used throughout the target integrated circuit layout and a number of violations of each design rule respectively associated with the first set of violations and second set of violations; and
   forming a rule database, wherein statistics associated with the rule usage rate are defined and utilized in subsequent implementation of the target integrated circuit layout.

2. The method of claim 1, wherein the plurality of design rules comprise the minimum rules and standard rules used in the target integrated circuit layout, wherein the minimum rules are associated with smallest limitations of the respective design rules, and wherein the standard rules are associated with limitations that are greater than the respective minimum rules.

3. The method of claim 1, wherein the rule usage rate further comprises a number of violations of each design rule respectively associated with the first set of violations and second set of violations.

4. The method of claim 1, wherein forming the rule database comprises forming a searchable database of the rule usage rate and one or more of the first set of violations, second set of violations, each design rule respectively associated with the first set of violations and second set of violations, and the frequency of usage of each of the plurality of design rules.

5. The method of claim 1, further comprising replacing one or more of the design rules respectively associated with the first set of violations and second set of violations and one or more of the minimum rules with a standard rule based, at least in part, on the rule usage rate, therein defining a modified integrated circuit layout.

6. The method of claim 5, wherein replacing one or more of the design rules respectively associated with the first set of violations and second set of violations and one or more of the minimum rules with the standard rule generally improves a pass/fail yield rate associated with the target integrated circuit layout.

7. The method of claim 5, wherein performing the first design rule check, performing the second design rule check, performing the analysis, determining the rule usage rate, and forming the rule database is repeated after substituting the target integrated circuit layout with the modified integrated circuit layout.

8. The method of claim 5, further comprising generating a photolithography mask based on the modified integrated circuit layout.

9. The method of claim 1, further comprising mapping the rule usage rate across the target integrated circuit layout.

10. The method of claim 9, wherein mapping the rule usage rate across the target integrated circuit layout further comprises marking rules as acceptable or unacceptable based on one or more of the analysis and an operator intervention.

11. The method of claim 1, wherein recording the first set of violations and second set of violations of the plurality of design rules further comprises recording a value associated with each design rule respectively associated with the first set of violations and second set violations of the plurality of design rules.

12. The method of claim 11, wherein the value associated with each design rule respectively associated with the first set of violations and second set violations of the plurality of design rules comprises a measurement of a feature associated with the respective design rule.

13. The method of claim 1, wherein the plurality of design rules comprise one or more of width, spacing, minimum area, and antenna rules.

14. The method of claim 1, wherein the target integrated circuit layout is provided in a Graphic Database System (GDS) format.

15. The method of claim 1, further comprising generating a photolithography mask based on the modified integrated circuit layout.

16. A method for generating a photolithography mask, the method comprising:
   providing a computer program product having a non-transitory computer readable medium with a computer program embodied thereon, the computer program comprising a computer program code for:
   providing a target integrated circuit layout having a plurality of design rules associated therewith;
   performing a first design rule check on the target integrated circuit layout, wherein a first set of violations of the plurality of design rules and each design rule respectively associated with the first set of violations are recorded;
   performing a second design rule check on the target integrated circuit layout, wherein a second set of violations of the plurality of design rules and each design rule respectively associated with the second set violations are recorded;
   performing an analysis of the first set of violations, second set of violations, each design rule respectively associated with the first set of violations and second set of violations, and a frequency of usage of each of the plurality of design rules;
   determining a rule usage rate comprising a number of the frequency of usage of minimum rules used overall and a number of violations of each design rule respectively associated with the first set of violations and second set of violations;
   forming a rule database, wherein statistics associated with the rule usage rate are defined;
   replacing one or more of the design rules respectively associated with the first set of violations and second set of violations and one or more of the minimum rules with a standard rule based, at least in part, on the rule usage rate, therein defining a modified integrated circuit layout; and generating a photolithography mask based on the modified integrated circuit layout.

17. The method of claim 16, wherein the plurality of design rules comprise the minimum rules and standard rules used in the target integrated circuit layout, wherein the minimum rules are associated with smallest limitations of the respective design rules, and wherein the standard rules are associated with limitations that are greater than the respective minimum rules.

18. The method of claim 16, wherein replacing one or more of the design rules respectively associated with the first set of violations and second set of violations and one or more of the minimum rules with a standard rule generally improves a pass/fail yield rate associated with the modified integrated circuit layout compared to a pass/fail yield rate associated with the target integrated circuit layout.

19. The method of claim 16, wherein performing the first design rule check, performing the second design rule check, performing the analysis, determining the rule usage rate, and forming the rule database is performed iteratively.

20. The method of claim 16, wherein recording the first set of violations and second set of violations of the plurality of design rules further comprises recording a value associated with each design rule respectively associated with the first set of violations and second set violations of the plurality of design rules, and wherein the value associated with each design rule respectively associated with the first set of violations and second set violations of the plurality of design rules comprises a measurement of a feature associated with the respective design rule.

21. The method of claim 16, wherein forming the rule database comprises forming a searchable database of the rule usage rate and one or more of the first set of violations, second set of violations, each design rule respectively associated with the first set of violations and second set of violations, and the frequency of usage of each of the plurality of design rules.

22. A computer program product for analyzing a design rule coverage rate, the computer program product having a non-transitory computer readable medium with a computer program embodied thereon, the computer program comprising a computer program code for:

providing a target integrated circuit layout having a plurality of design rules associated therewith;

performing a first design rule check on the target integrated circuit layout, wherein a first set of violations of the plurality of design rules and each design rule respectively associated with the first set of violations are recorded;

performing a second design rule check on the target integrated circuit layout, wherein a second set of violations of the plurality of design rules and each design rule respectively associated with the second set violations are recorded;

performing an analysis of the first set of violations, second set of violations, each design rule respectively associated with the first set of violations and second set of violations, and a frequency of usage of each of the plurality of design rules;

determining a rule usage rate comprising an overall number of the frequency of usage of minimum rules used and a number of violations of each design rule respectively associated with the first set of violations and second set of violations; and forming an interactive rule database, wherein statistics associated with the rule usage rate are defined and utilized in subsequent implementation of the target integrated circuit layout.

23. The computer program product of claim 22, wherein the plurality of design rules comprise the minimum rules and standard rules used in the target integrated circuit layout, wherein the minimum rules are associated with smallest limitations of the respective design rules, and wherein the standard rules are associated with limitations that are greater than the respective minimum rules.

24. The computer program product of claim 22, wherein the rule usage rate further comprises a number of violations of the design rule respectively associated with the first set of violations and second set of violations.

25. The computer program product of claim 22, wherein forming the interactive rule database comprises forming a searchable database of the rule usage rate and one or more of the first set of violations, second set of violations, each design rule respectively associated with the first set of violations and second set of violations, and the frequency of usage of each of the plurality of design rules.

* * * * *

UNITED STATES PATENT AND TRADEMARK OFFICE
CERTIFICATE OF CORRECTION

PATENT NO.        : 8,806,417 B1
APPLICATION NO.   : 13/871165
DATED             : August 12, 2014
INVENTOR(S)       : Chih-Ming Chao et al.

Page 1 of 1

It is certified that error appears in the above-identified patent and that said Letters Patent is hereby corrected as shown below:

On the Title Page, item (54) and in the Specification, column 1, line 1, In the Title please Correct from "Rule Coverage Rate Auto-Extraction and Rule Number Auto-Mark" to -- Design Rule Coverage Rate Auto-Extraction and Rule Number Auto-Mark --

Signed and Sealed this
Eighteenth Day of November, 2014

Michelle K. Lee
*Deputy Director of the United States Patent and Trademark Office*